(12) United States Patent
Lung

(10) Patent No.: US 7,884,342 B2
(45) Date of Patent: Feb. 8, 2011

(54) PHASE CHANGE MEMORY BRIDGE CELL

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/831,819

(22) Filed: Jul. 31, 2007

(65) Prior Publication Data

US 2009/0032796 A1 Feb. 5, 2009

(51) Int. Cl.
*H01L 29/02* (2006.01)

(52) U.S. Cl. .................. 257/2; 257/3; 257/4; 257/5; 257/E29.02; 438/102; 438/103; 365/163

(58) Field of Classification Search .................. 257/1–5, 257/E29.002; 438/102–103; 365/163
See application file for complete search history.

(56) References Cited

U.S. PATENT DOCUMENTS

| | | | |
|---|---|---|---|
| 3,530,441 A | | 9/1970 | Ovshinsky |
| 3,846,767 A | * | 11/1974 | Cohen ..................... 327/198 |
| 4,599,705 A | | 7/1986 | Holmberg et al. |
| 4,719,594 A | | 1/1988 | Young et al. |
| 4,876,220 A | | 10/1989 | Mohsen et al. |
| 4,959,812 A | | 9/1990 | Momodomi et al. |
| 5,166,096 A | | 11/1992 | Cote et al. |
| 5,166,758 A | | 11/1992 | Ovshinsky et al. |
| 5,177,567 A | | 1/1993 | Klersy et al. |
| 5,332,923 A | | 7/1994 | Takeuchi et al. |
| 5,391,901 A | | 2/1995 | Tanabe et al. |
| 5,515,488 A | | 5/1996 | Stephens, Jr. |
| 5,534,712 A | | 7/1996 | Ovshinsky et al. |
| 5,687,112 A | | 11/1997 | Ovshinsky |
| 5,789,277 A | | 8/1998 | Zahorik et al. |
| 5,789,758 A | | 8/1998 | Reinberg |
| 5,814,527 A | | 9/1998 | Wolstenholme et al. |

(Continued)

FOREIGN PATENT DOCUMENTS

WO   WO-00/79539   12/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Bradley K Smith
*Assistant Examiner*—Jami M Valentine
(74) *Attorney, Agent, or Firm*—Haynes Beffel & Wolfeld LLP

(57) ABSTRACT

Memory devices are described along with manufacturing methods. An embodiment of a memory device as described herein includes a conductive bit line and a plurality of first electrodes. The memory device includes a plurality of insulating members, the insulating members having a thickness between a corresponding first electrode and a portion of the bit line acting as a second electrode. The memory device further includes an array of bridges of memory material having at least two solid phases, the bridges contacting respective first electrodes and extending across the corresponding insulating member to the bit line. The bridges define an interelectrode path between the corresponding first electrode and the bit line defined by the thickness of the insulating member.

16 Claims, 22 Drawing Sheets

U.S. PATENT DOCUMENTS

| | | | |
|---|---|---|---|
| 5,831,276 | A | 11/1998 | Gonzalez et al. |
| 5,837,564 | A | 11/1998 | Sandhu et al. |
| 5,869,843 | A | 2/1999 | Harshfield |
| 5,879,955 | A | 3/1999 | Gonzalez et al. |
| 5,902,704 | A | 5/1999 | Schoenborn et al. |
| 5,920,788 | A | 7/1999 | Reinberg |
| 5,952,671 | A | 9/1999 | Reinberg et al. |
| 5,958,358 | A | 9/1999 | Tenne et al. |
| 5,970,336 | A | 10/1999 | Wolstenholme et al. |
| 5,985,698 | A | 11/1999 | Gonzalez et al. |
| 5,998,244 | A | 12/1999 | Wolstenholme et al. |
| 6,011,725 | A | 1/2000 | Eitan et al. |
| 6,025,220 | A | 2/2000 | Sandhu |
| 6,031,287 | A | 2/2000 | Harshfield |
| 6,034,882 | A | 3/2000 | Johnson et al. |
| 6,066,870 | A | 5/2000 | Siek |
| 6,077,674 | A | 6/2000 | Schleifer et al. |
| 6,077,729 | A | 6/2000 | Harshfield |
| 6,087,269 | A | 7/2000 | Williams |
| 6,087,674 | A | 7/2000 | Ovshinsky et al. |
| 6,104,038 | A | 8/2000 | Gonzalez et al. |
| 6,111,264 | A | 8/2000 | Wolstenholme et al. |
| 6,114,713 | A | 9/2000 | Zahorik |
| 6,117,720 | A | 9/2000 | Harshfield |
| 6,147,395 | A | 11/2000 | Gilgen |
| 6,150,253 | A | 11/2000 | Doan et al. |
| 6,153,890 | A | 11/2000 | Wolstenholme et al. |
| 6,177,317 | B1 | 1/2001 | Huang et al. |
| 6,185,122 | B1 | 2/2001 | Johnson et al. |
| 6,189,582 | B1 | 2/2001 | Reinberg et al. |
| 6,236,059 | B1 | 5/2001 | Wolstenholme et al. |
| RE37,259 | E | 7/2001 | Ovshinsky |
| 6,271,090 | B1 | 8/2001 | Huang et al. |
| 6,280,684 | B1 | 8/2001 | Yamada et al. |
| 6,287,887 | B1 | 9/2001 | Gilgen |
| 6,314,014 | B1 | 11/2001 | Lowrey et al. |
| 6,320,786 | B1 | 11/2001 | Chang et al. |
| 6,339,544 | B1 | 1/2002 | Chiang et al. |
| 6,351,406 | B1 | 2/2002 | Johnson et al. |
| 6,372,651 | B1 | 4/2002 | Yang et al. |
| 6,420,215 | B1 | 7/2002 | Knall et al. |
| 6,420,216 | B1 | 7/2002 | Clevenger et al. |
| 6,420,725 | B1 | 7/2002 | Harshfield |
| 6,423,621 | B2 | 7/2002 | Doan et al. |
| 6,429,064 | B1 | 8/2002 | Wicker |
| 6,462,353 | B1 | 10/2002 | Gilgen |
| 6,483,736 | B2 | 11/2002 | Johnson et al. |
| 6,487,114 | B2 | 11/2002 | Jong et al. |
| 6,501,111 | B1 | 12/2002 | Lowrey |
| 6,511,867 | B2 | 1/2003 | Lowrey et al. |
| 6,512,241 | B1 | 1/2003 | Lai |
| 6,514,788 | B2 | 2/2003 | Quinn |
| 6,534,781 | B2 | 3/2003 | Dennison |
| 6,545,903 | B1 | 4/2003 | Wu |
| 6,555,860 | B2 | 4/2003 | Lowrey et al. |
| 6,563,156 | B2 | 5/2003 | Harshfield |
| 6,566,700 | B2 | 5/2003 | Xu |
| 6,567,293 | B1 | 5/2003 | Lowrey et al. |
| 6,579,760 | B1 | 6/2003 | Lung et al. |
| 6,586,761 | B2 | 7/2003 | Lowrey |
| 6,589,714 | B2 | 7/2003 | Maimon et al. |
| 6,593,176 | B2 | 7/2003 | Dennison |
| 6,597,009 | B2 | 7/2003 | Wicker |
| 6,605,527 | B2 | 8/2003 | Dennison et al. |
| 6,605,821 | B1 | 8/2003 | Lee et al. |
| 6,607,974 | B2 | 8/2003 | Harshfield |
| 6,613,604 | B2 | 9/2003 | Maimon et al. |
| 6,617,192 | B1 | 9/2003 | Lowrey et al. |
| 6,620,715 | B1 | 9/2003 | Blosse et al. |
| 6,621,095 | B2 | 9/2003 | Chiang et al. |
| 6,627,530 | B2 | 9/2003 | Li et al. |
| 6,639,849 | B2 | 10/2003 | Takahashi et al. |
| 6,673,700 | B2 | 1/2004 | Dennison et al. |
| 6,744,088 | B1 | 6/2004 | Dennison |
| 6,746,892 | B2 | 6/2004 | Lee et al. |
| 6,791,102 | B2 | 9/2004 | Johnson et al. |
| 6,797,979 | B2 | 9/2004 | Chiang et al. |
| 6,800,504 | B2 | 10/2004 | Li et al. |
| 6,800,563 | B2 | 10/2004 | Xu |
| 6,805,563 | B2 | 10/2004 | Ohashi et al. |
| 6,808,991 | B1 | 10/2004 | Tung et al. |
| 6,815,704 | B1 | 11/2004 | Chen |
| 6,830,952 | B2 | 12/2004 | Lung et al. |
| 6,850,432 | B2 | 2/2005 | Lu et al. |
| 6,859,389 | B2 | 2/2005 | Idehara et al. |
| 6,861,267 | B2 | 3/2005 | Xu et al. |
| 6,864,500 | B2 | 3/2005 | Gilton |
| 6,864,503 | B2 | 3/2005 | Lung et al. |
| 6,867,638 | B2 | 3/2005 | Saiki et al. |
| 6,888,750 | B2 | 5/2005 | Walker et al. |
| 6,894,305 | B2 | 5/2005 | Yi et al. |
| 6,903,362 | B2 | 6/2005 | Wyeth et al. |
| 6,909,107 | B2 | 6/2005 | Rodgers et al. |
| 6,927,410 | B2 | 8/2005 | Chen |
| 6,933,516 | B2 | 8/2005 | Xu |
| 6,936,840 | B2 | 8/2005 | Sun et al. |
| 6,937,507 | B2 | 8/2005 | Chen |
| 6,972,430 | B2 | 12/2005 | Casagrande et al. |
| 6,992,932 | B2 | 1/2006 | Cohen et al. |
| 7,023,009 | B2 | 4/2006 | Kostylev et al. |
| 7,033,856 | B2 | 4/2006 | Lung et al. |
| 7,042,001 | B2 | 5/2006 | Kim et al. |
| 7,067,864 | B2 | 6/2006 | Nishida et al. |
| 7,067,865 | B2 | 6/2006 | Lung et al. |
| 7,122,281 | B2 | 10/2006 | Pierrat |
| 7,122,824 | B2 | 10/2006 | Khouri et al. |
| 7,126,149 | B2 | 10/2006 | Iwasaki et al. |
| 7,132,675 | B2 | 11/2006 | Gilton |
| 7,166,533 | B2 | 1/2007 | Happ |
| 7,214,958 | B2 | 5/2007 | Happ |
| 7,220,983 | B2 | 5/2007 | Lung |
| 7,277,317 | B2 | 10/2007 | Le Phan et al. |
| 2001/0055838 | A1 | 12/2001 | Walker et al. |
| 2002/0081833 | A1 | 6/2002 | Li et al. |
| 2002/0168852 | A1* | 11/2002 | Harshfield et al. ......... 438/650 |
| 2002/0182835 | A1 | 12/2002 | Quinn |
| 2004/0037106 | A1* | 2/2004 | Lu et al. ........................ 365/96 |
| 2004/0051094 | A1 | 3/2004 | Ooishi |
| 2004/0051161 | A1 | 3/2004 | Tanaka et al. |
| 2004/0166604 | A1* | 8/2004 | Ha et al. ..................... 438/102 |
| 2005/0029502 | A1 | 2/2005 | Hudgens |
| 2005/0093022 | A1 | 5/2005 | Lung |
| 2005/0127347 | A1 | 6/2005 | Choi et al. |
| 2005/0167656 | A1 | 8/2005 | Sun et al. |
| 2005/0191804 | A1 | 9/2005 | Lai et al. |
| 2005/0201182 | A1 | 9/2005 | Osada et al. |
| 2005/0211978 | A1* | 9/2005 | Bu et al. ....................... 257/40 |
| 2005/0212024 | A1 | 9/2005 | Happ |
| 2005/0215009 | A1 | 9/2005 | Cho |
| 2006/0043617 | A1 | 3/2006 | Abbott |
| 2006/0108667 | A1 | 5/2006 | Lung |
| 2006/0110878 | A1 | 5/2006 | Lung et al. |
| 2006/0118913 | A1 | 6/2006 | Yi et al. |
| 2006/0154185 | A1 | 7/2006 | Ho et al. |
| 2006/0175599 | A1 | 8/2006 | Happ |
| 2006/0226409 | A1 | 10/2006 | Burr et al. |
| 2006/0234138 | A1 | 10/2006 | Fehlhaber et al. |
| 2006/0284157 | A1 | 12/2006 | Chen et al. |
| 2006/0284158 | A1 | 12/2006 | Lung et al. |
| 2006/0284214 | A1 | 12/2006 | Chen |
| 2006/0284279 | A1 | 12/2006 | Lung et al. |
| 2006/0286709 | A1 | 12/2006 | Lung et al. |
| 2006/0286743 | A1 | 12/2006 | Lung et al. |
| 2007/0030721 | A1 | 2/2007 | Segal et al. |

| | | |
|---|---|---|
| 2007/0037101 A1 | 2/2007 | Morioka |
| 2007/0045606 A1 | 3/2007 | Magistretti et al. |
| 2007/0108077 A1 | 5/2007 | Lung et al. |
| 2007/0108429 A1 | 5/2007 | Lung |
| 2007/0108430 A1* | 5/2007 | Lung .............................. 257/4 |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0224726 A1 | 9/2007 | Chen et al. |
| 2007/0246699 A1 | 10/2007 | Lung |
| 2007/0257300 A1 | 11/2007 | Ho et al. |
| 2007/0262388 A1 | 11/2007 | Ho et al. |
| 2007/0285960 A1 | 12/2007 | Lung et al. |

FOREIGN PATENT DOCUMENTS

| | | |
|---|---|---|
| WO | WO-01/45108 | 6/2001 |

OTHER PUBLICATIONS

Adler, D. et al., "Threshold Switching in Chalgenid-Glass Thin Films," J. Appl/Phys 51(6), Jun. 1980, pp. 3289-3309.

Ahn, S.J. et al., "A Highly Manufacturable High Density Phase Change Memory og 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory,"AFIT/GE/ENG/00M-04, Mar. 2000 121 pages.

Chen, et al., "Non-Volatile Resistive Switching for Advanced Memory Applications," IEEE IEDM, Dec. 5-7, 2005, 4 pp.

Cho, S.L. et al., "Highly Scalable On-axis Confined Cell Structure for High Density PRAM beyond 256Mb," 2005 Symposium on VLSI Technology Digest of Technical Papers, pp. 96-97.

Gibson, G.A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y.H. et al., "An Edge Contact Type Cell from Phase Change RAM Featuring Very Low Power Consumtion," 2003 Symposium on VSLI Technology Digest of Technical Papers, pp. 175-176.

Happ, T.D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-Change RAM Based on 0.24 μm-CMOS Technologies," 2003 Symposium on VLSI Technology Digest of Technical Papers, pp. 173-174.

Iwasaki, Hiroko et al, "Completely Erasable Phase Change Optical Disk," Jpn. J. Appl. Phys., Feb. 1992, pp. 461-465, vol. 31.

Jeong, C.W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43$^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org <http://www.sciencenews.org>, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, :http://klabs.org/richcontent/MAPLDCon99/Papers/P21_Tyson_P.

PDF#search=nonvolatile%20
high%20density%20high%20performance%20phase%20change
%20memory <http://klabs.org/richcontent/MAPLDCon99/Papers/
P21_Tyson_P.
PDF#search='nonvolatile%20high%20density%20high%20performance%20phase%20change%20memory>', 8 pages.

Wolf, Stanley, Excerpt from: Silicon Processing for the VLSI Era-vol. 4, pp. 674-679, 2004.

Wicker, Guy, "A Comprehensive Model of Submicron Chalcogenide Switching Devices," Doctoral Dissertation, Wayne State University, Detroit, MI, 1996.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Ahn, S. J. et al., "Highly Reliable 5nm Contact Cell Technology for 256Mb PRAM," VLSI Technology, Digest of Technical Papers, Jun. 14-16, 2005, pp. 98-99.

Chao, D-S. et al., "Low Programming Current Phase Change Memory Cell with Double gst Thermally Confined Structure," VLSI-TSA 2007, International symposium Apr. 23-25, 2007, 2pp.

"Thermal Conductivity of Crystalline Dielectrics" in CRC Handbook of Chemistry and Physics, Internet Version 2007, (87th edition), David R. Lide, ed. Taylor and Francis, Boca Raton, FL.

Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

"Optimized Thermal Capacitance in a Phase Change Memory Cell Design," IPCOM000141986D, IP.com Prior Art Database, Oct. 18, 2006, 4 pp.

* cited by examiner

PHASE CHANGE MEMORY BRIDGE CELL

CROSS-REFERENCE TO RELATED APPLICATIONS

This application is related to commonly owned U.S. patent application Ser. No. 11/697,492, filed 6 Apr. 2007, entitled Phase Change Memory Bridge Cell with Diode Isolation Device, by inventor Hsiang-Lan Lung, herein incorporated in entirety by reference.

PARTIES TO A JOINT RESEARCH AGREEMENT

International Business Machines Corporation, a New York corporation; Macronix International Corporation, a Taiwan corporation, and Infineon Technologies A.G., a German corporation, are parties to a Joint Research Agreement.

BACKGROUND OF THE INVENTION

1. Field of the Invention

The present invention relates to high density memory devices based on phase change based memory materials, including chalcogenide based materials and on other programmable resistive materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or break down the crystalline structure, after which the phase change material cools quickly, quenching the phase change process, allowing at least a portion of the phase change structure to stabilize in the amorphous state. It is desirable to minimize the magnitude of the reset current used to cause transition of phase change material from the crystalline state to the amorphous state. The magnitude of the reset current needed for reset can be reduced by reducing the size of the phase change material element in the cell and of the contact area between electrodes and the phase change material, so that higher current densities are achieved with small absolute current values through the phase change material element.

A technology developed by the assignee of the present application is referred to as a phase change bridge cell, in which a very small patch of memory material is formed as a bridge across a thin film insulating member between electrodes. The phase change bridge is easily integrated with logic and other types of circuitry on integrated circuits. See, U.S. application Ser. No. 11/155,067, filed 17 Jun. 2005, entitled "Thin Film Fuse Phase Change RAM and Manufacturing Method," by Lung et al., which application was owned at the time of invention and is currently owned by the same assignee.

Problems have arisen in manufacturing such devices with very small dimensions, and with variations in process that meet tight specifications needed for large-scale memory devices. It is desirable therefore to provide a memory cell structure with an array architecture supporting high-density devices, and a method for manufacturing such structure that meets tight process variation specifications needed for large-scale memory devices. Furthermore, it is desirable to produce memory devices having a small active phase change region.

SUMMARY OF THE INVENTION

An embodiment of a memory device as described herein includes a conductive bit line and a plurality of first electrodes. The memory device includes a plurality of insulating members, the insulating members having a thickness between a corresponding first electrode and a portion of the bit line acting as a second electrode. The memory device further includes an array of bridges of memory material having at least two solid phases, the bridges contacting respective first electrodes and extending across the corresponding insulating member to the bit line. The bridges define an inter-electrode path between the corresponding first electrode and the bit line defined by the thickness of the insulating member.

An embodiment of a method for manufacturing an array of memory cells as described herein includes forming a conductive bit line. The method includes forming a plurality of first electrodes and forming a plurality of insulating members, the insulating members having a thickness between a corresponding first electrode and a portion of the bit line acting as a second electrode. The method further includes forming an array of bridges of memory material having at least two solid phases, the bridges contacting respective first electrodes and extending across the corresponding insulating member to the bit line. The bridges define an inter-electrode path between the corresponding first electrode and the bit line defined by the thickness of the insulating member.

Other aspects and advantages of the invention are described below with reference to the figures.

DETAILED DESCRIPTION

Figure 1:
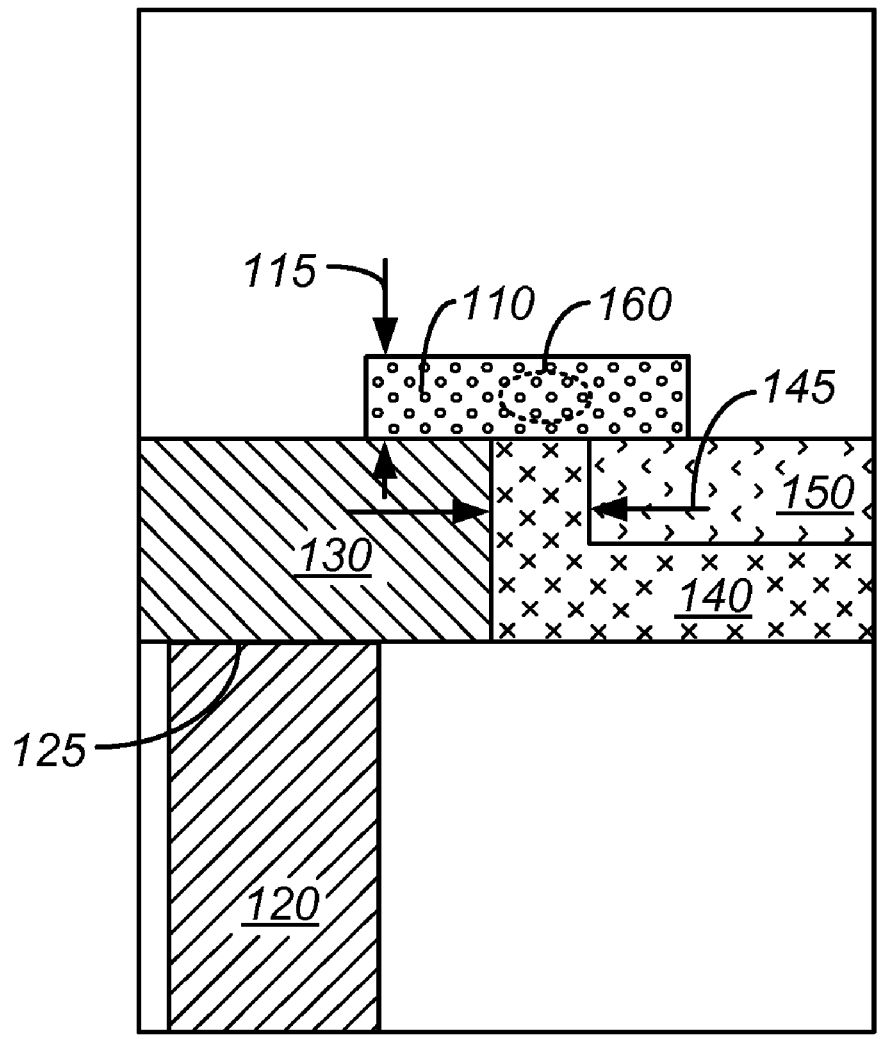
FIG. 1 illustrates a cross-sectional view of a memory cell in accordance with an embodiment.

The following description of the invention will typically be with reference to specific structural embodiments and methods. It is understood that there is no intention to limit the invention to the specifically disclosed embodiments and methods but that the invention may be practiced using other features, elements, methods, and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

A detailed description is provided with reference to FIGS. 1-11C.

FIG. 1 illustrates a cross-sectional view of a memory cell 100 having a phase change memory bridge 110 in accordance with an embodiment. The memory cell 100 is formed on a contact 120 having a contact surface 125. Contact 120 extends through an inter-layer dielectric (not shown) to underlying access circuitry (not shown), formed using tungsten or another conductive material in the illustrated embodiment. Other contact structures can be used as well.

A first electrode 130 comprising conductive material is on the contact 120. An insulating member 140 has a thickness 145 between the first electrode 130 and a bit line 150. The bridge of memory material 110 contacts the first electrode 130 and extends across the insulating member 140 to the bit line 150. In operation, voltages on the contact 120 and the bit line 150 can induce current to flow from the contact 120 to the bit line 150, or vice-versa, via the first electrode 130 and the bridge 110 of memory material.

The active region 160 is the region of the bridge 110 in which the memory material is induced to change between at least two solid phases. As can be appreciated the active region 160 can be made extremely small in the illustrated structure, reducing the magnitude of current needed to induce the phase changes. The inter-electrode path length between the first electrode 130 and the bit line 150 is defined by the thickness 145 of the insulating member 140. In representative embodiments, the thickness 145 of the insulating member 140 can be established using a thin film deposition technique to form a thin sidewall dielectric on the sidewall of the first electrode 130. In preferred embodiments the thickness 145 is less than a minimum feature size for a process, for example a lithographic process, used to form the memory cell 100. Likewise, the thickness 115 of the bridge 110 of memory material can be very small, for example less than a minimum feature size for a process used to form the memory cell 100. The thickness 115 can be established using a thin film deposition technique of memory material on the first electrode 130, the insulating member 140, and the bit line 150. In some embodiments the thickness 115 is less than or equal to about 10 nm, for example being between about 1 and 10 nm. As can be appreciated, the thickness 145 of the insulating member 140 and the thickness 115 of the bridge 110 can be well controlled, such that an array of memory cells having bridges 110 can have small performance variations from cell to cell in the array.

Embodiments of the memory cell 100 include phase change based memory materials, including chalcogenide based materials and other materials, for the bridge 110. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2 Sb_2 Te_5$, $GeSb_2 Te_4$ and $GeSb_4 Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined empirically or by modeling, and specifically adapted to a particular phase change alloy. In following sections of the disclosure, the phase change material is referred to as GST, and it will be understood that other types of phase change materials can be used. A material useful for implementation of a PCRAM described herein is $Ge_2 Sb_2 Te_5$.

The following are short summaries describing four types of resistive memory materials.

1. Chalcogenide Material $Ge_xSb_yTe_z$ x:y:z=2:2:5

Or other compositions with x: 0~5; y: 0~5; z: 0~10

GeSbTe with doping, such as N—, Si—, Ti—, or other element doping may also be used.

Formation method: By PVD sputtering or magnetron-sputtering method with reactive gases of Ar, $N_2$, and/or He, etc chalcogenide @ the pressure of 1 mtorr~100 mtorr. The deposition is usually done at room temperature. The collimator with aspect ratio of 1~5 can be used to improve the fill-in performance. To improve the fill-in performance, the DC bias of several ten to several hundred volts is also used. On the other hand, the combination of DC bias and the collimator can be used simultaneously.

The post deposition annealing treatment with vacuum or N2 ambient is sometimes needed to improve the crystallize state of chalcogenide material. The annealing temperature typically ranges 100C to 400C with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

2. CMR (colossal magneto resistance) material $Pr_xCa_yMnO_3$ x:y=0.5:0.5

Or other compositions with x: 0~1; y: 0~1

Another CMR material that includes Mn oxide may be used

Formation method: By PVD sputtering or magnetron-sputtering method with reactive gases of Ar, $N_2$, $O_2$, and/or He, etc. at the pressure of 1 mtorr~100 mtorr. The deposition temperature can range from room temperature to ~600C, depending on the post deposition treatment condition. A collimator with an aspect ratio of 1~5 can be used to improve the fill-in performance. To improve the fill-in performance, the DC bias of several ten to several hundred volts is also used. On the other hand, the combination of DC bias and the collimator can be used simultaneously. A magnetic field of several ten gauss to 10,000 gauss may be applied to improve the magnetic crystallized phase.

The post deposition annealing treatment with vacuum or $N_2$ ambient or $O_2/N_2$ mixed ambient may be needed to improve the crystallized state of CMR material. The annealing temperature typically ranges 400C to 600C with an anneal time of less than 2 hours.

The thickness of CMR material depends on the design of cell structure. The CMR thickness of 10 nm to 200 nm can be used to be the core material.

A buffer layer of YBCO (YBaCuO3, a kind of high temperature superconductor material) is often used to improve the crystallized state of CMR material. The YBCO is deposited before the deposition of CMR material. The thickness of YBCO ranges 30 nm to 200 nm.

3. 2-element Compound $Ni_xO_y$; $Ti_xO_y$; $Al_xO_y$; $W_xO_y$; $Zn_xO_y$; $Zr_xO_y$; $Cu_xO_y$; etc x:y=0.5:0.5

Other compositions with x: 0~1; y: 0~1

Formation method:

1. Deposition: By PVD sputtering or magnetron-sputtering method with reactive gases of Ar, $N_2$, $O_2$, and/or He, etc. at the pressure of 1 mtorr~100 mtorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimator with an aspect ratio of 1~5 can be used to improve the fill-in performance. To improve the fill-in performance, the DC bias of several ten to several hundred volts is also used. If desired, they combination of DC bias and the collimator can be used simultaneously.

The post deposition annealing treatment with vacuum or $N_2$ ambient or $O_2/N_2$ mixed ambient as sometimes needed to improve the oxygen distribution of metal oxide. The annealing temperature ranges 400C to 600C with an anneal time of less than 2 hours.

2. Reactive deposition: By PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mtorr~100 mtorr, using a target of metal oxide, such as Ni, Ti, Al, W, Zn, Zr, or Cu etc. The deposition is usually done at room temperature. A collimator with an aspect ratio of 1~5 can be used to improve the fill-in performance. To improve the fill-in performance, a DC bias of several ten to several hundred volts is also used. If desired, the combination of DC bias and the collimator can be used simultaneously.

The post deposition annealing treatment with vacuum or $N_2$ ambient or $O_2/N_2$ mixed ambient is sometimes needed to improve the oxygen distribution of metal oxide. The annealing temperature ranges 400C to 600C with an anneal time of less than 2 hours.

3. Oxidation: By a high temperature oxidation system, such as furnace or RTP system. The temperature ranges from 200C to 700C with pure $O_2$ or $N_2/O_2$ mixed gas at a pressure of several mtorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mtorr to 100 mtorr is used to oxidize the surface of metal, such as Ni, Ti, Al, W, Zn, Zr, or Cu etc. The oxidation time ranges several seconds to several minutes. The oxidation temperature ranges room temperature to 300C, depending on the degree of plasma oxidation.

4. Polymer Material

TCNQ with doping of Cu, $C_{60}$, Ag etc.

PCBM-TCNQ mixed polymer

Formation method:

1. Evaporation: By thermal evaporation, e-beam evaporation, or molecular beam epitaxy (MBE) system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of 10-4 torr to 10-10 torr. The wafer temperature ranges from room temperature to 200C.

The post deposition annealing treatment with vacuum or $N_2$ ambient is sometimes needed to improve the composition distribution of polymer material. The annealing temperature ranges room temperature to 300C with an anneal time of less than 1 hour.

2. Spin-coat: By a spin-coater with the doped-TCNQ solution @ the rotation of less than 1000 rpm. After spin-coating, the wafer is put to wait the solid-state formation @ room temperature or temperature of less than 200C. The waiting time ranges from several minutes to days, depending on the temperature and on the formation conditions.

An exemplary method for forming chalcogenide material uses the PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

Figure 2A:
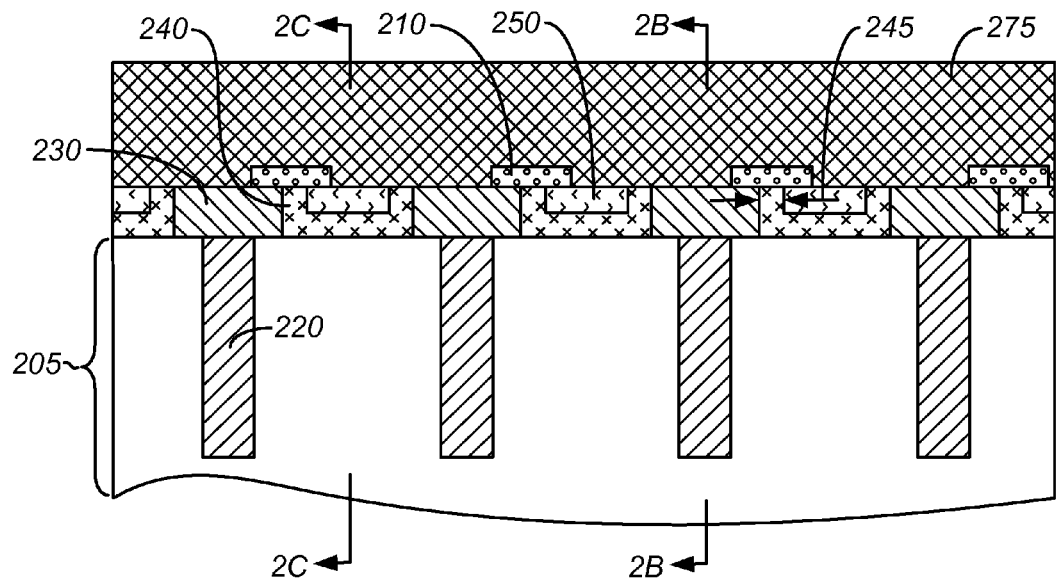
FIGS. 2A through 2C illustrate cross-sectional views of a portion of a memory device in accordance with an embodiment.
Figure 2B:
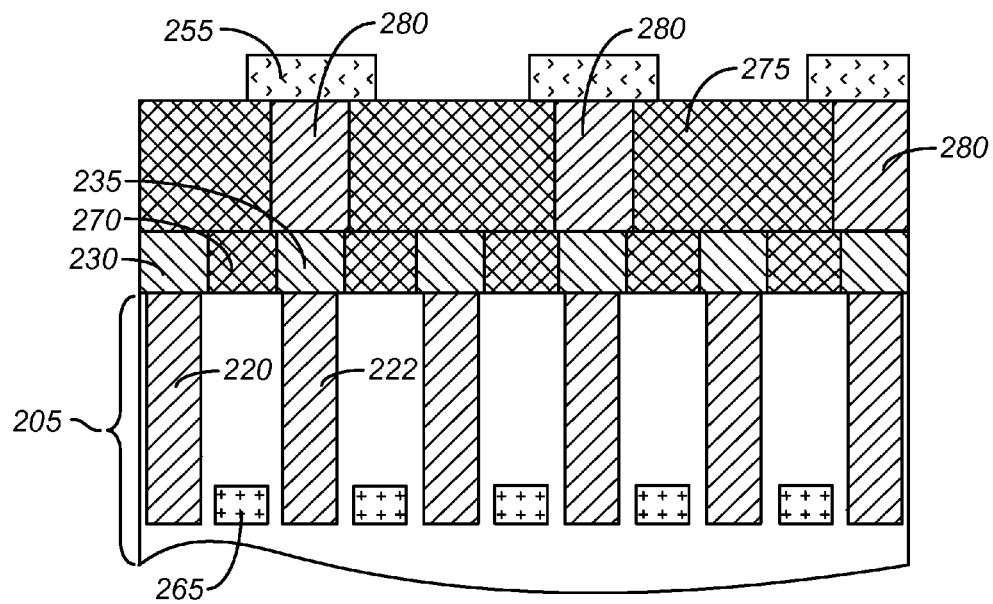
Figure 2C:
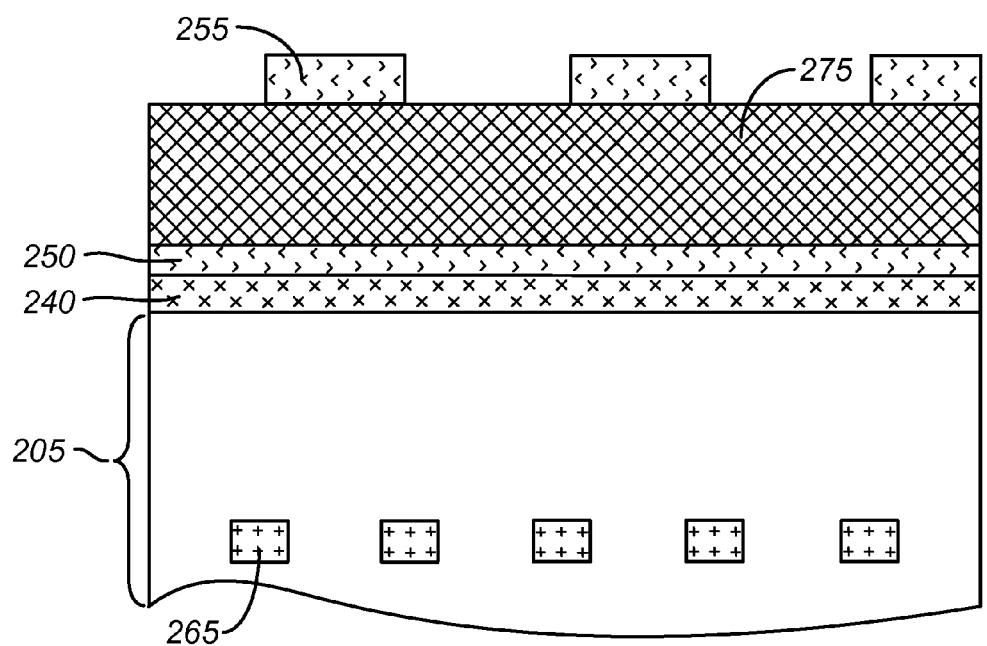
Figure 2D:
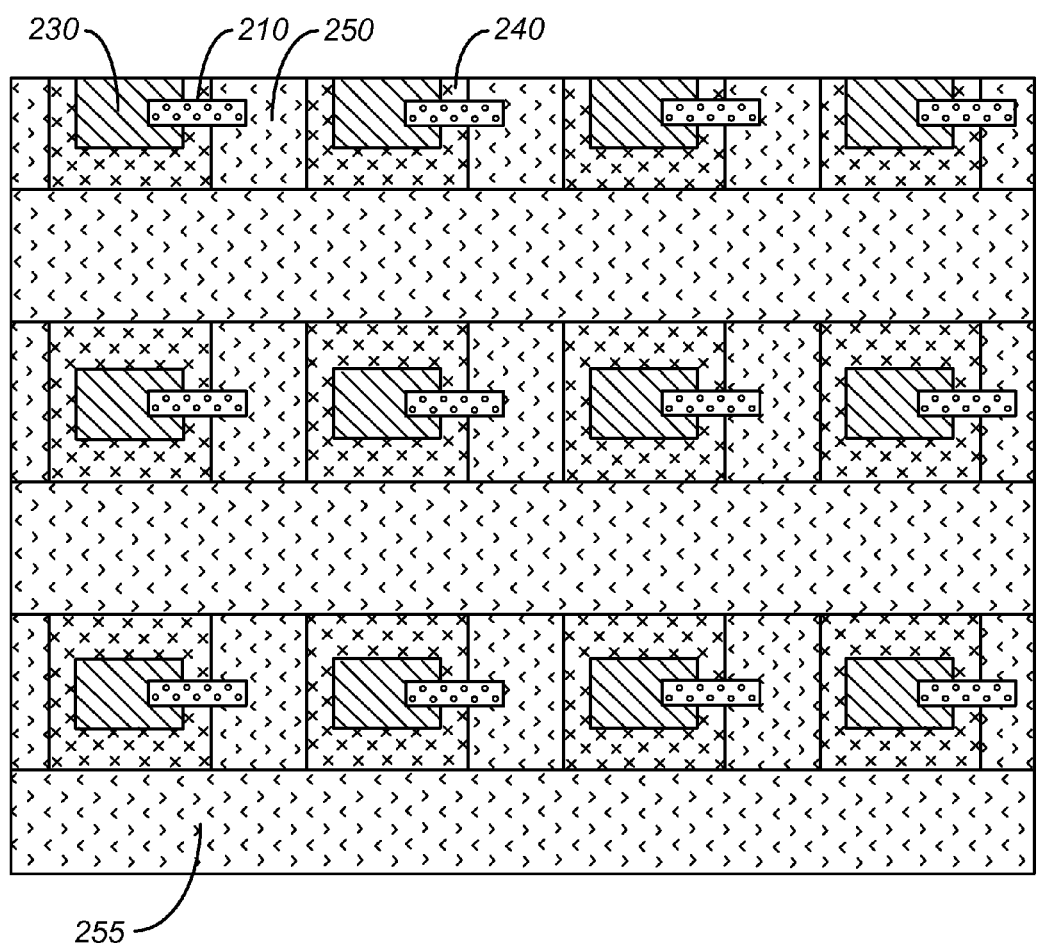
FIG. 2D illustrates a top view of a portion of the memory device of FIGS. 2A-2C.

FIGS. 2A-2C are cross-sectional views of a portion of a memory device in accordance with an embodiment. FIG. 2A is a cross-section taken orthogonal to bit lines 250 and includes substrate 205 having access circuitry for a plurality of memory cells. FIG. 2B and FIG. 2C are respective cross-sections taken orthogonal to source lines 255. FIG. 2D is a top view, or plan view, of the array of memory cells illustrated in FIGS. 2A-2C. The second dielectric material 275 is omitted from FIG. 2D for clarity.

Substrate 205 can be formed in a variety of ways. Any method, known or to be developed, for forming the elements of substrate 205 as described herein can be used. The substrate 205 includes access circuitry formed on a semiconductor substrate (not shown) for a plurality of memory cells. Access circuitry in the illustrated embodiment includes conductive word lines 265 forming the gates of access transistors, and pairs of doped regions (not shown) adjacent to the word lines 265 forming the source and drain regions of the access transistors. The word lines 265 extend in parallel in a first direction into and out of the cross-section illustrated in FIG. 2B. Substrate 205 includes an array of conductive drain contacts 220 and an array of conductive source contacts 222. The conductive drain contacts 220 are electrically coupled to access transistor drain regions, and the array of conductive source contacts 222 are electrically coupled to access transistor source regions. In the illustrated embodiment access transistor source regions are shared among adjacent access transistors. As can be appreciated, other configurations and structures of access circuitry and contacts 220, 222, as known or to be developed, can be used as well.

The memory device in the illustrated embodiment includes a plurality of bit lines 250, a plurality of first electrodes 230, and a plurality of insulating members 240. The bit lines 250 comprise conductive material extending in parallel in a second direction into and out of the cross-section illustrated in FIG. 2A. The insulating member 240 has a thickness 245 between a corresponding first electrode 230 and a portion of a bit line 250 acting as a second electrode. The first electrodes 230 are electrically coupled to corresponding conductive drain contacts 220.

The memory device in the illustrated embodiment includes an array of bridges 210 of memory material, the bridges 210 contacting respective first electrodes 230 and extending across the corresponding insulating member 240 to the corresponding bit line 250. An inter-electrode path between the corresponding first electrode 230 and bit line 250 has a path length defined by the thickness 245 of the insulating member 240.

The bridges 210 in the illustrated embodiment comprise memory material having at least two solid phases that are reversible, such as chalcogenide material or other related material, by applying a current through the bridge 210 or applying a voltage across the first electrodes 230 and the bit lines 250.

The array of memory cells in the illustrated embodiment includes conductive elements 235 in electrical contact with corresponding source contacts 222. First dielectric material 270 is between adjacent first electrodes 230 and conductive elements 235. Second dielectric material 275 overlies the first electrodes 230, bit lines 250, and bridges 210. An array of conductive vias 280 extends through the second dielectric material 275, the conductive vias 280 in electrical contact with corresponding conductive elements 235. Conductive source lines 255 extend in parallel in the first direction, the source lines 255 on the dielectric layer 275 and in electrical contact with conductive vias 280 in the plurality of conductive vias 280.

Figure 3A:
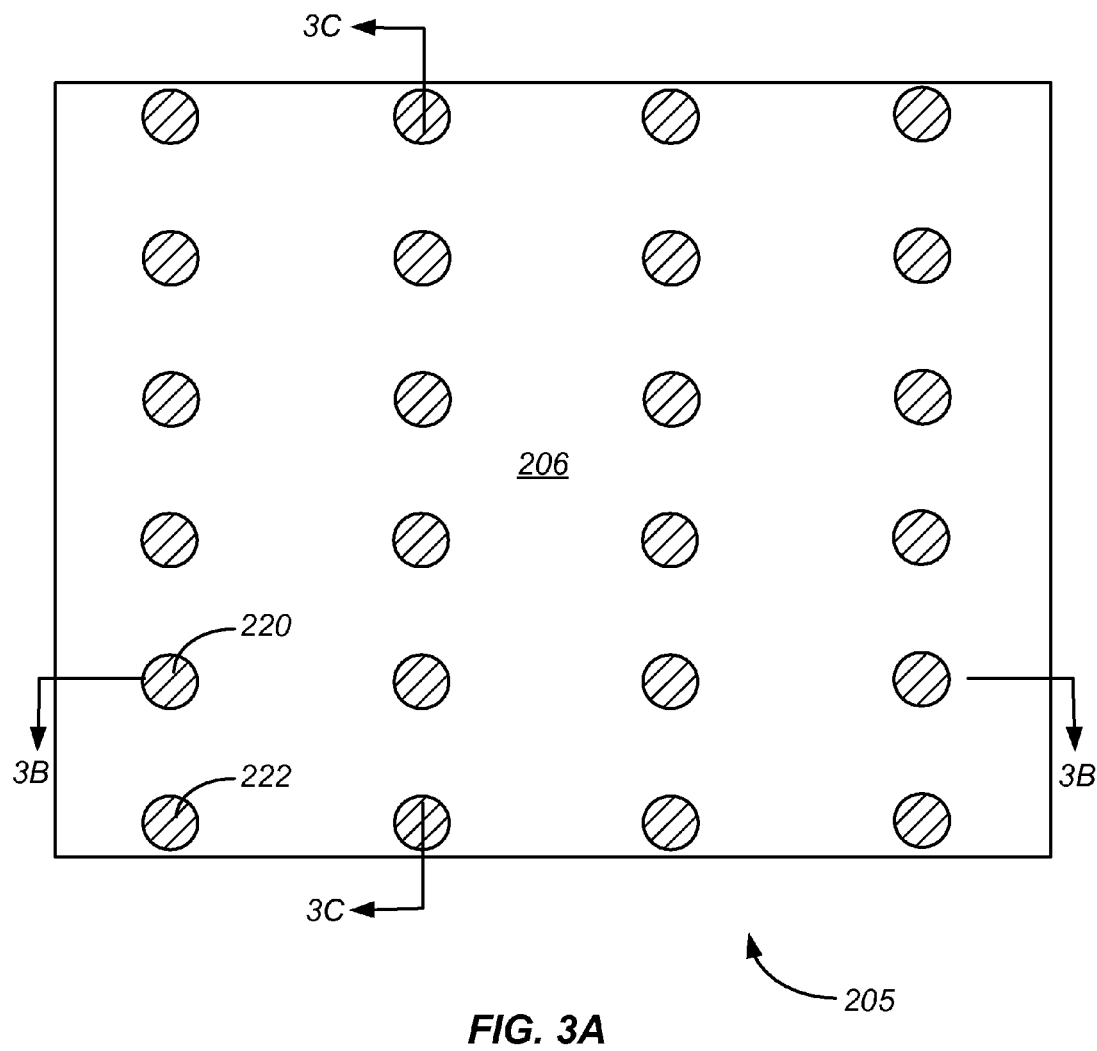
FIGS. 3A through 11C illustrate a fabrication sequence of a memory device in accordance with an embodiment.
Figure 3B:
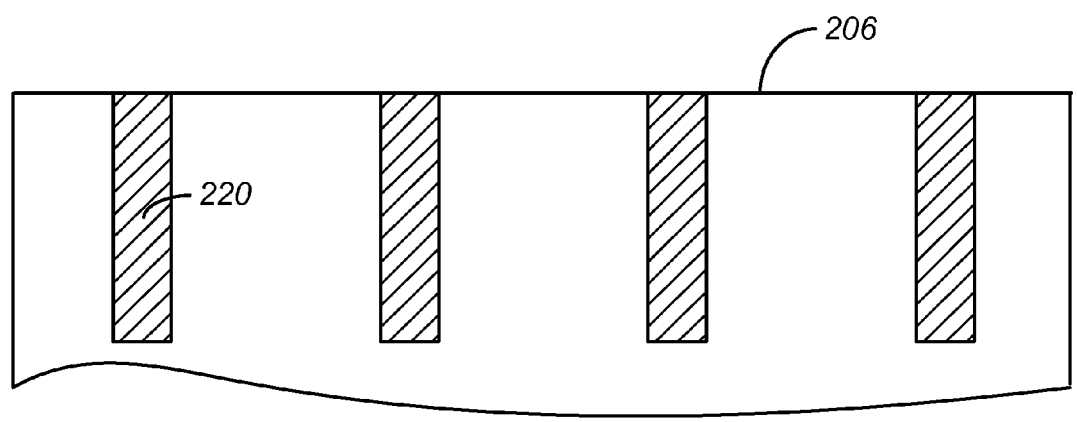
Figure 3C:
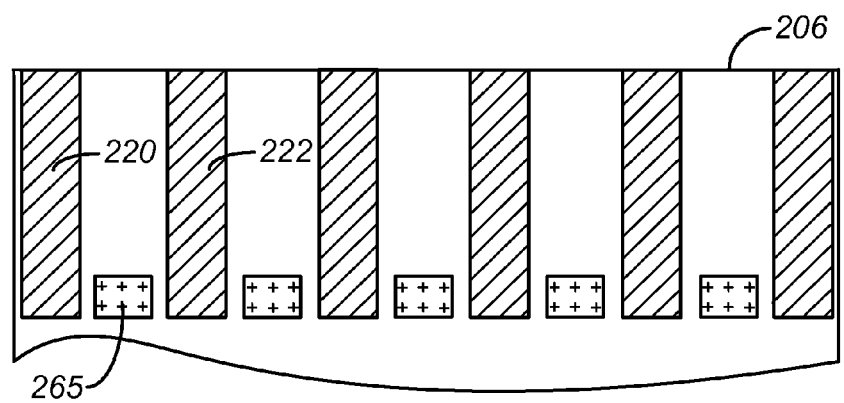

It will be understood that a wide variety of materials can be utilized in implementation of the conductive bit lines 250, word lines 265, first electrodes 230, conductive elements 235, and source lines 255, including metals such as aluminum, titanium nitride, and tungsten based materials as well as non-metal conductive material such as doped polysilicon. The first electrodes 230 and bit lines 250 in the illustrated embodiment are preferably TiN or TaN. Alternatively, the first electrodes 230 and bit lines 250 are TiAlN or TaAlN, or comprise, for further examples, one or more elements selected from the group consisting of Ti, W, Mo, Al, Ta, Cu, Pt, Ir, La, Ni, and Ru and alloys thereof FIGS. 3-10 illustrate an embodiment of a process flow for manufacturing a memory array, utilizing a memory cell as described herein. FIG. 3A illustrates a top view and FIGS. 3B-3C illustrate cross-sectional views of a first step in a process flow comprising providing a substrate 205. Substrate 205 includes access circuitry for a plurality of memory cells. Substrate 205 has a contact surface 206 with an array of conductive drain contacts 220 and an array of conductive source contacts 222 connected to the access circuitry. As described above, substrate 205 can be formed in a variety of ways and many other configurations and structures for access circuitry and contacts 222, 220 can be used as well.

Figure 4A:
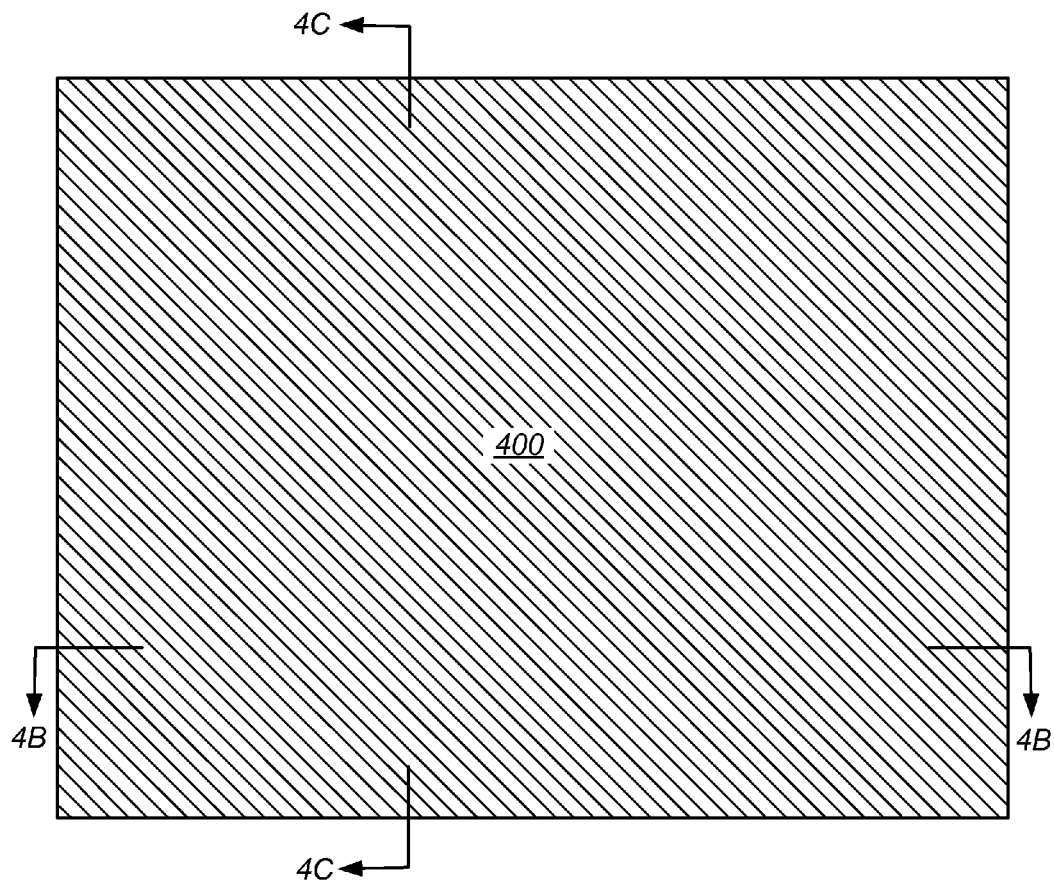
Figure 4B:
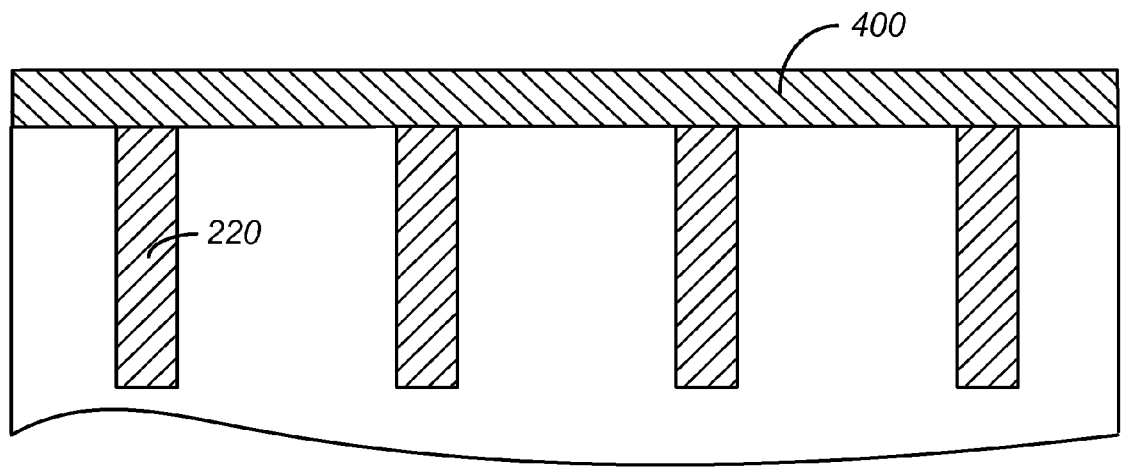
Figure 4C:
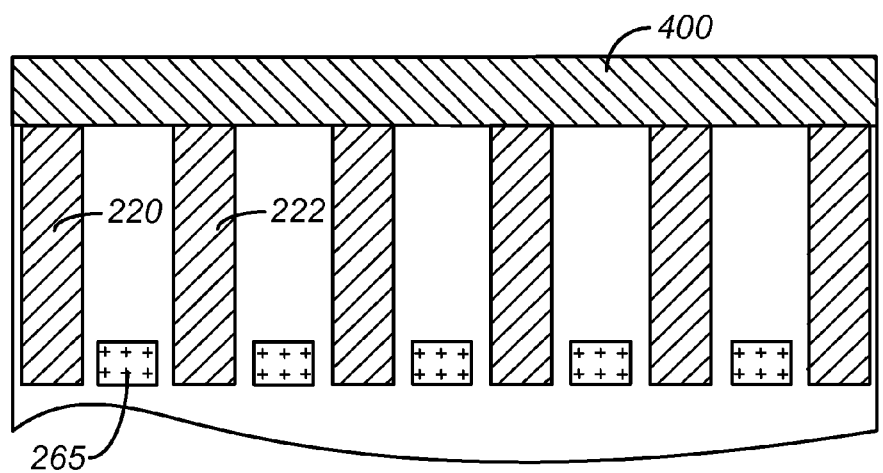

Next, a layer of conductive first electrode material 400 is formed on the contact surface 206 of the substrate 205, resulting in the structure illustrated in FIGS. 4A-4C.

Next, the first electrode material 400 of the structure illustrated in FIGS. 4A-4C is patterned to form a plurality of strips 500 extending in parallel in a first direction and defining first trenches between the strips 500. A first dielectric material 270 comprising, for example, silicon dioxide, is then formed in the first trenches, resulting in the structure illustrated in FIGS. 5A-5C. The dielectric material 270 can be formed by a fill-in process and planarized using, for example, chemical mechanical polishing CMP.

Figure 5A:
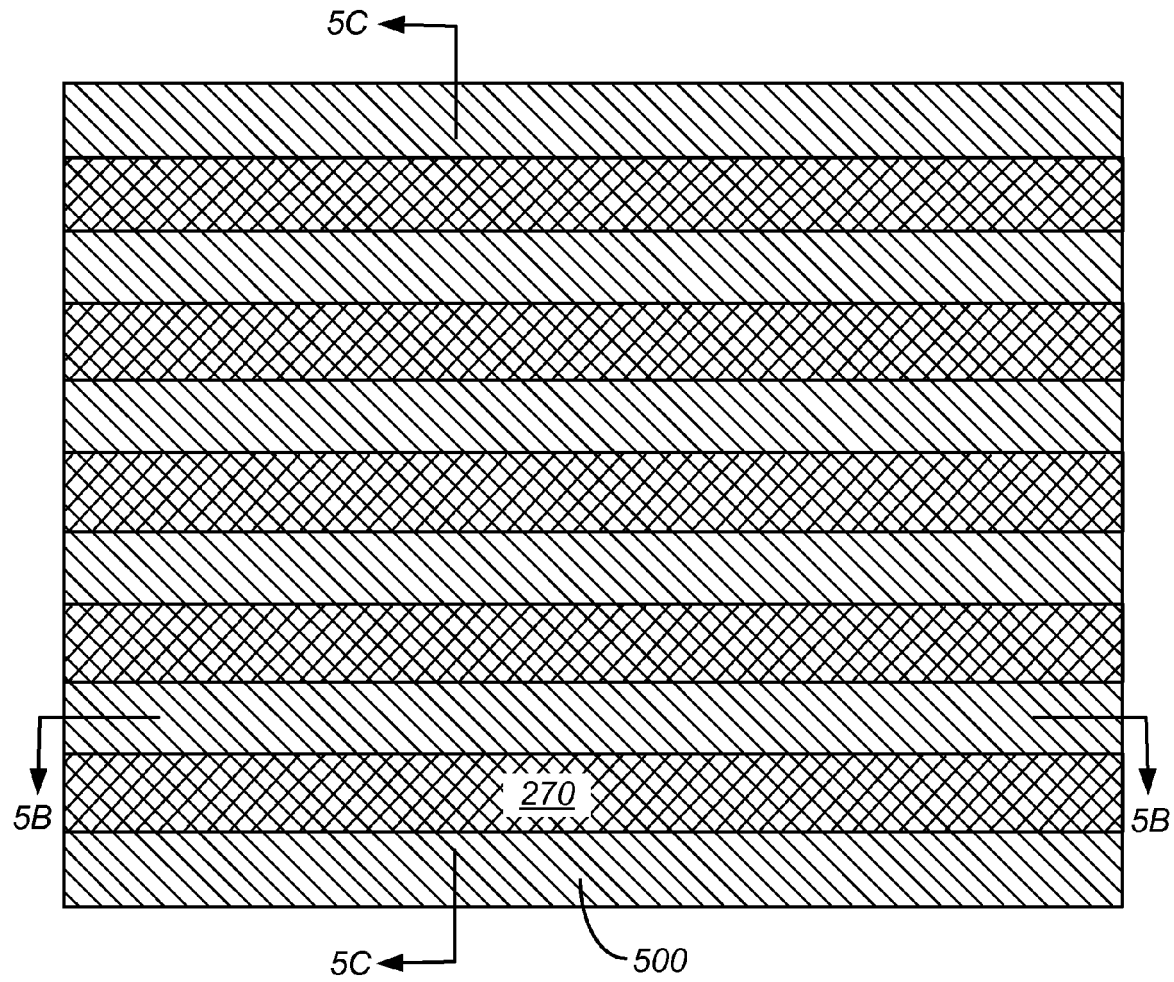
Figure 5B:
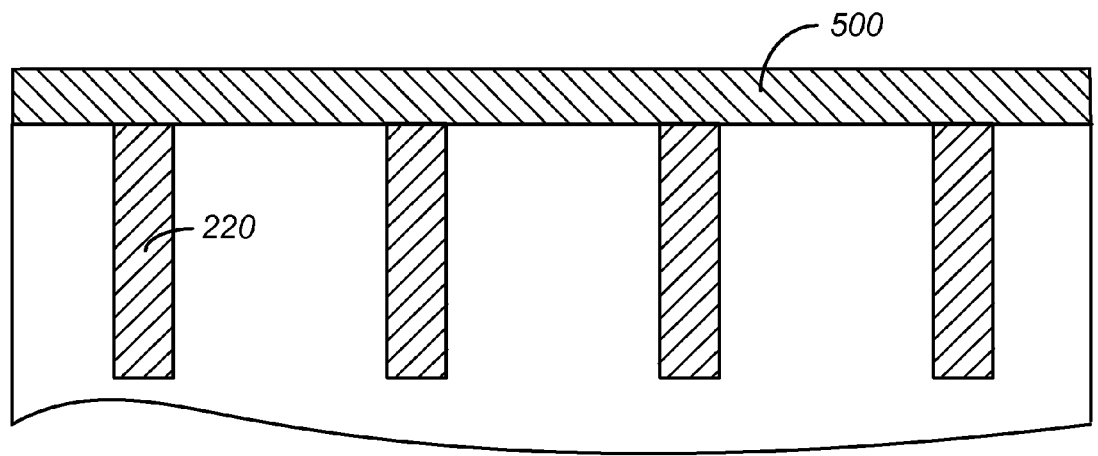
Figure 5C:
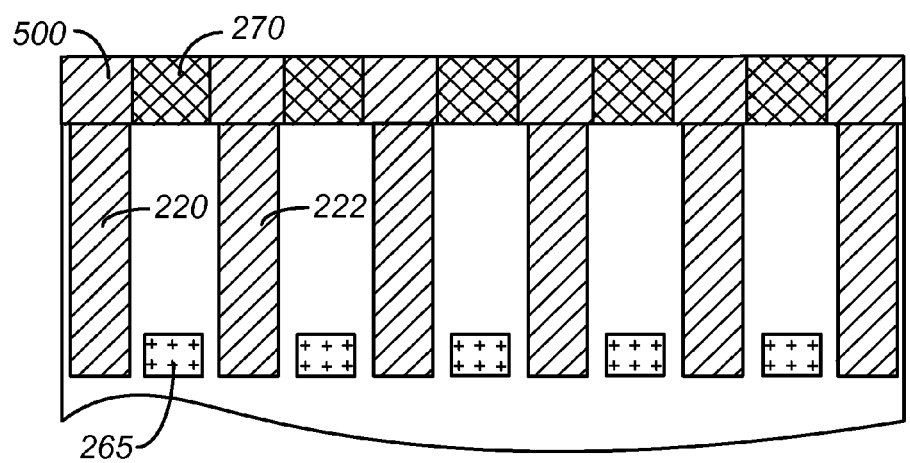
Figure 6A:
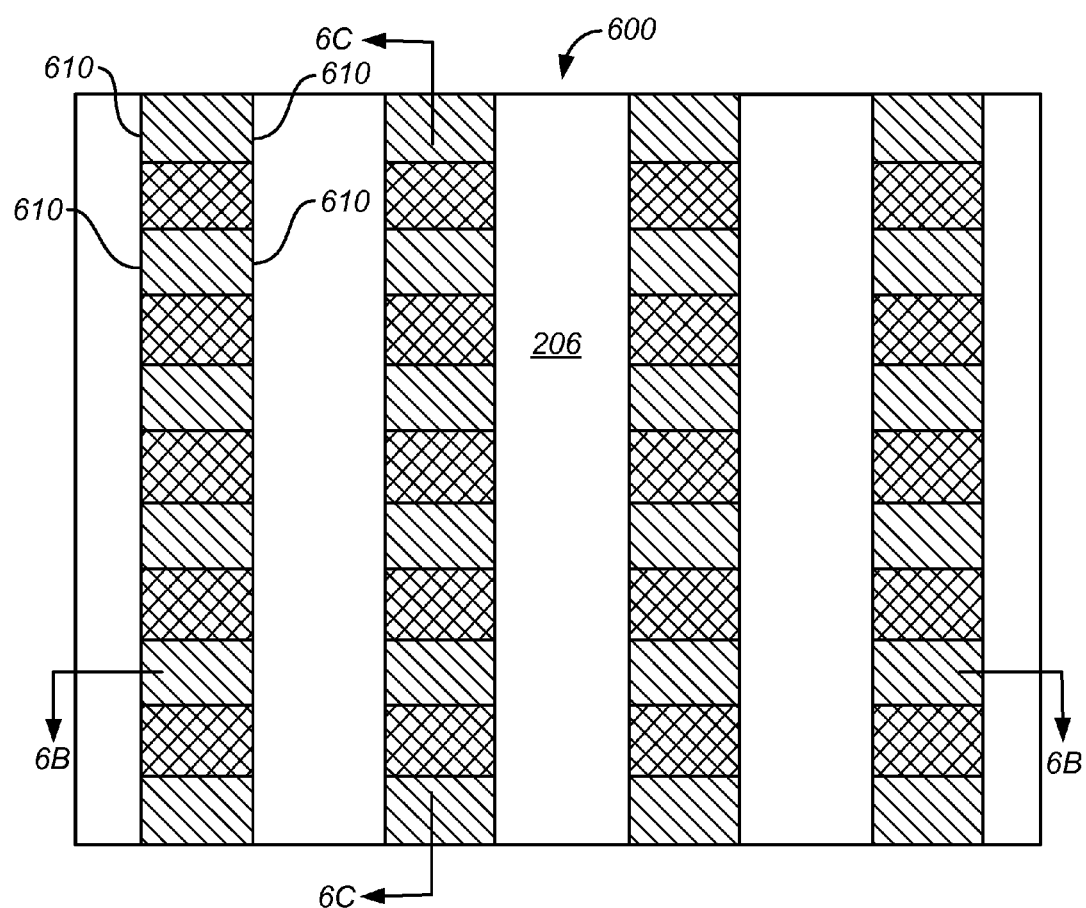
Figure 6B:
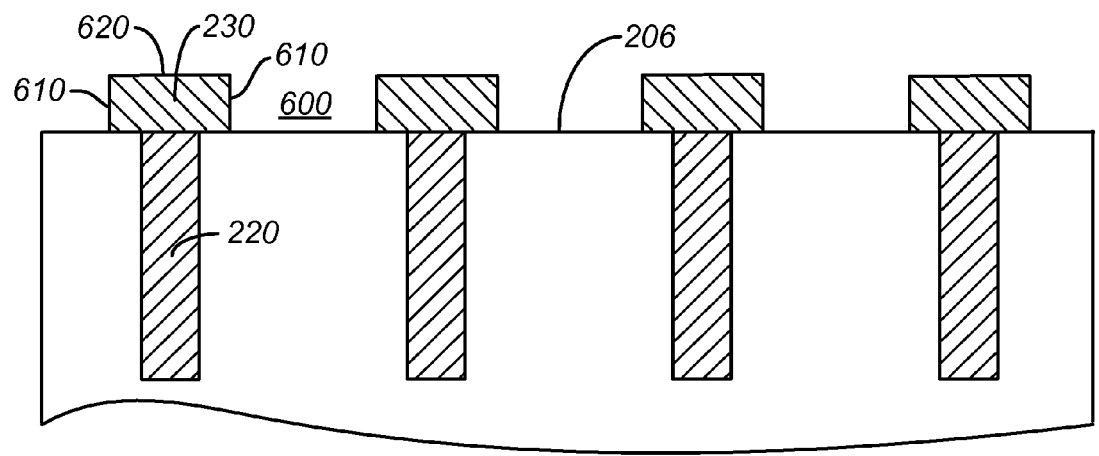
Figure 6C:
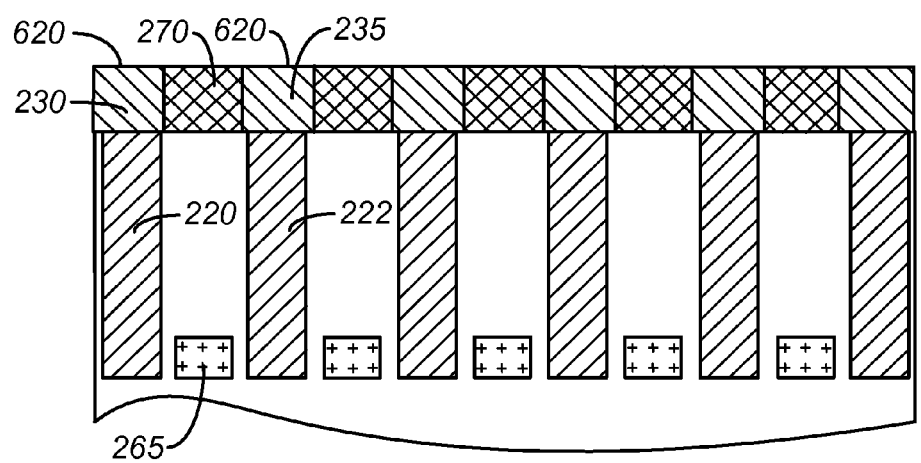

Next, a plurality of second trenches 600 are formed by etching the structure illustrated in FIGS. 5A-5C, resulting in the structure illustrated in FIGS. 6A-6C having a plurality of pairs of conductive elements 230, 235 between the second trenches 600. The second trenches extend in parallel in a second direction perpendicular to the first direction. As can be seen in FIGS. 6A-6C, the portions of the contact surface 206 beneath the trenches 600 are exposed. The pairs of conductive elements 230, 235 include a first conductive element comprising a first electrode 230 in electrical contact with a corresponding drain contact 220, and a second conductive element 235 in electrical contact with a corresponding source contact 222. The conductive elements 230, 235 have sidewall surfaces 610 and top surfaces 620.

Figure 7A:
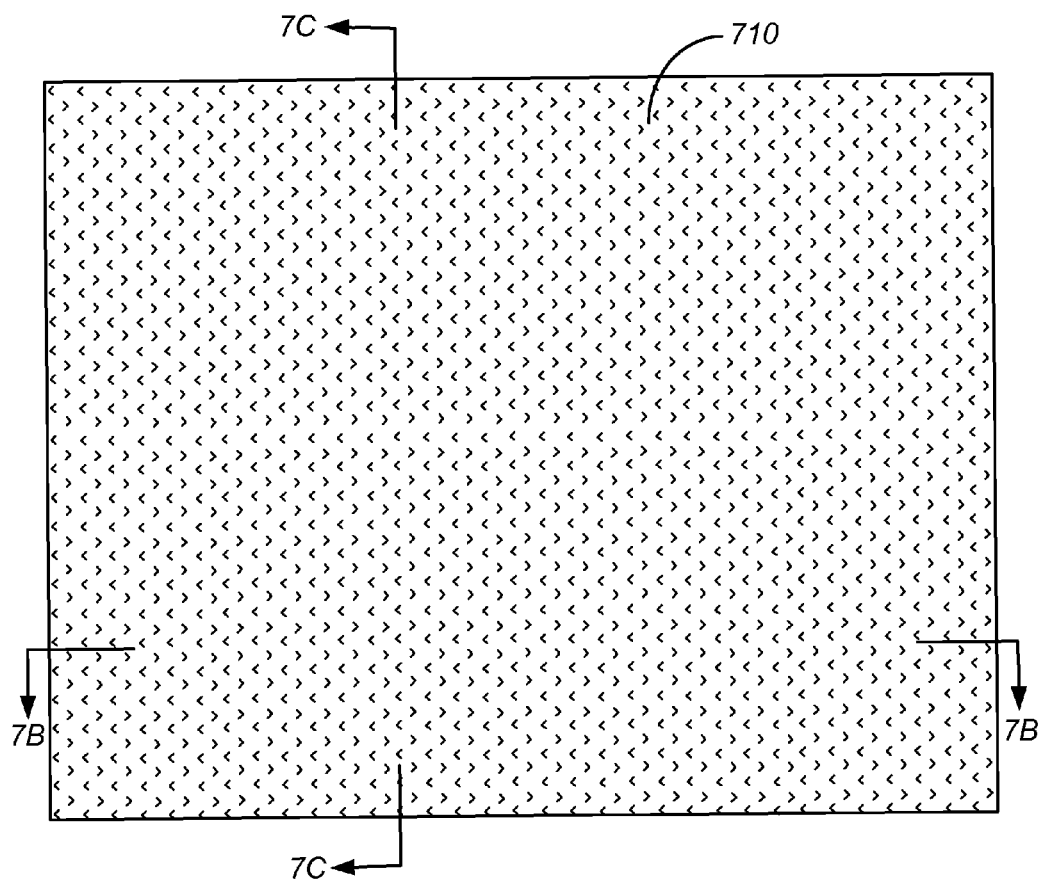
Figure 7B:
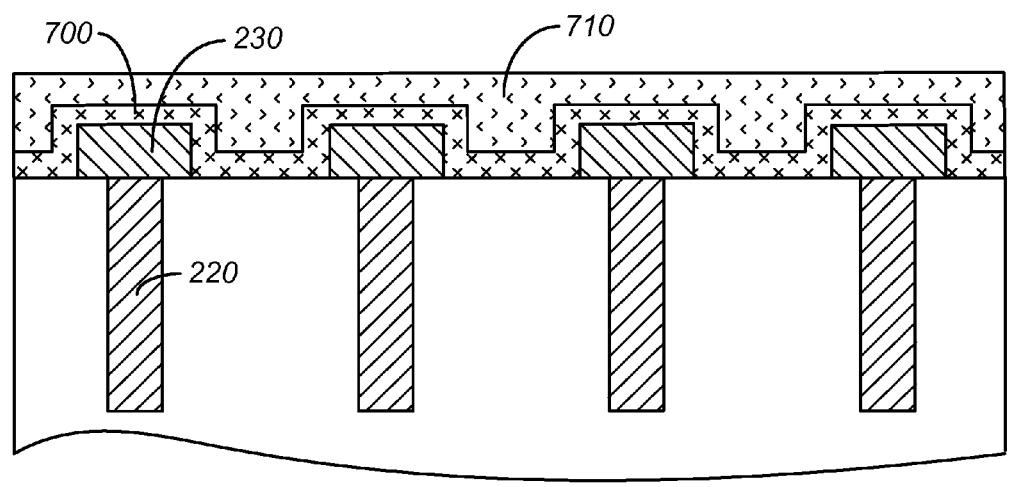
Figure 7C:
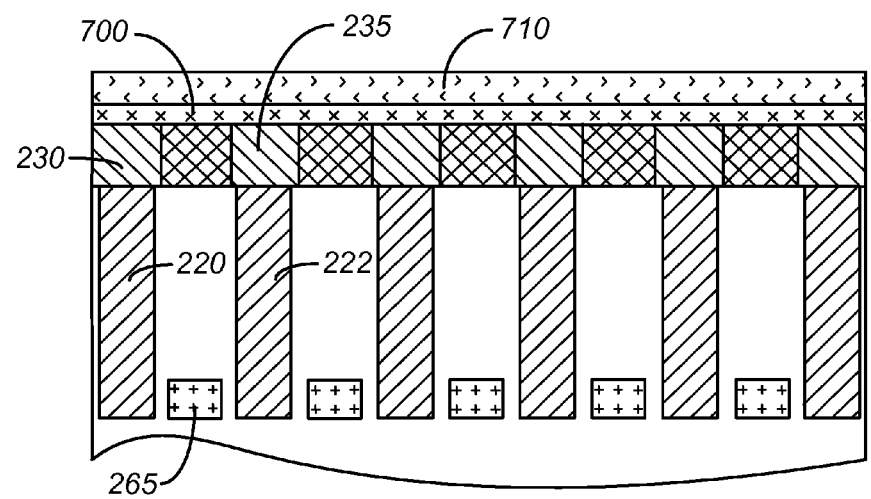

Next, a conformal layer of a sidewall dielectric material 700 is formed on the structure illustrated in FIGS. 6A-6C and a layer of bit line material 710 is formed on the sidewall dielectric material 700, resulting in the structure illustrated in FIGS. 7A-7C.

Figure 8A:
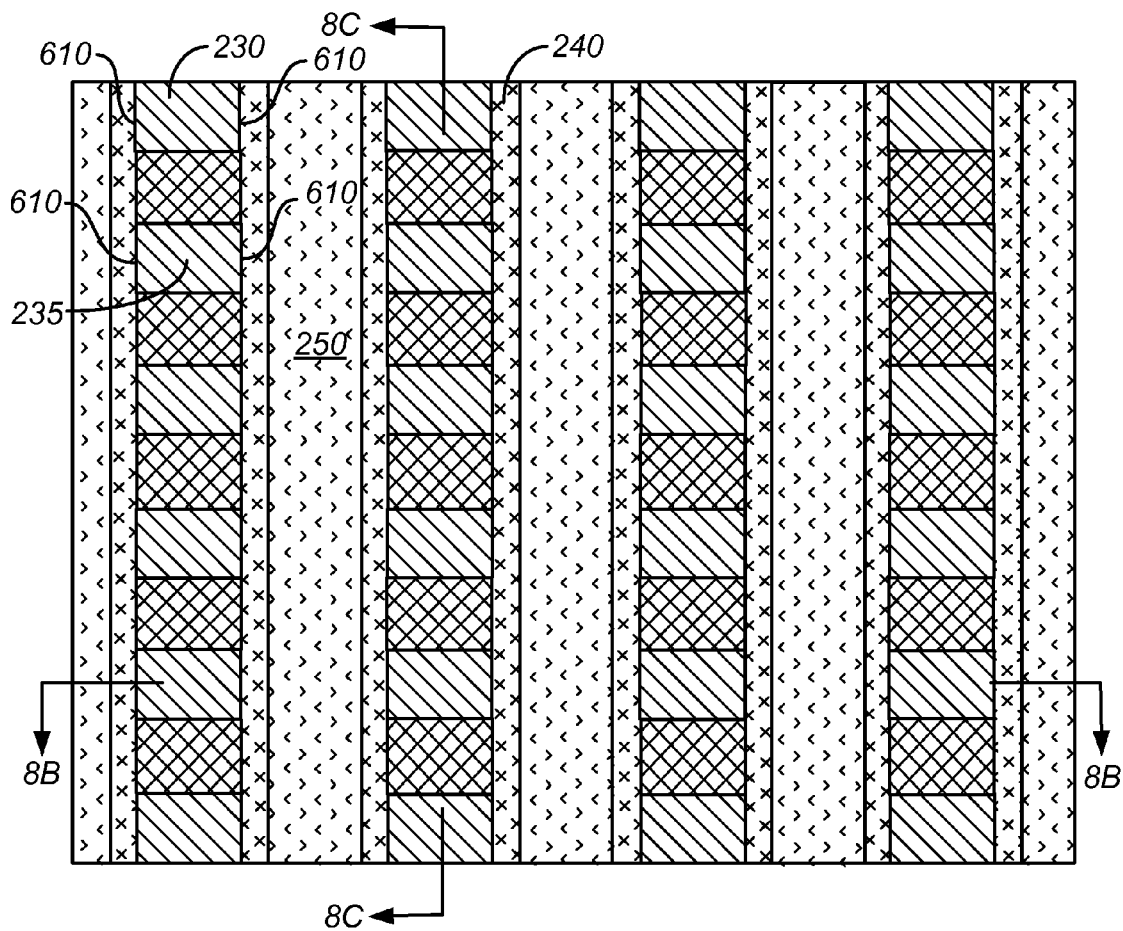
Figure 8B:
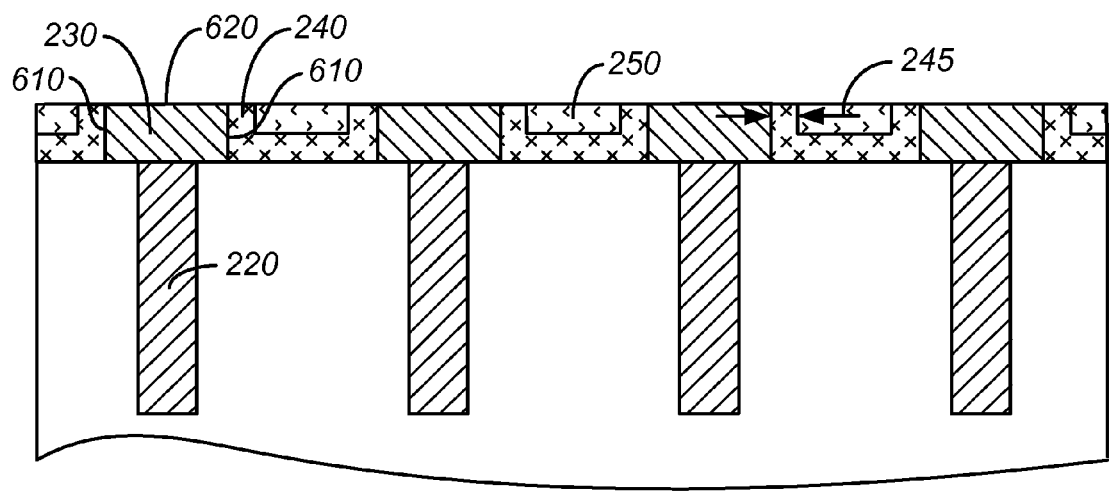
Figure 8C:
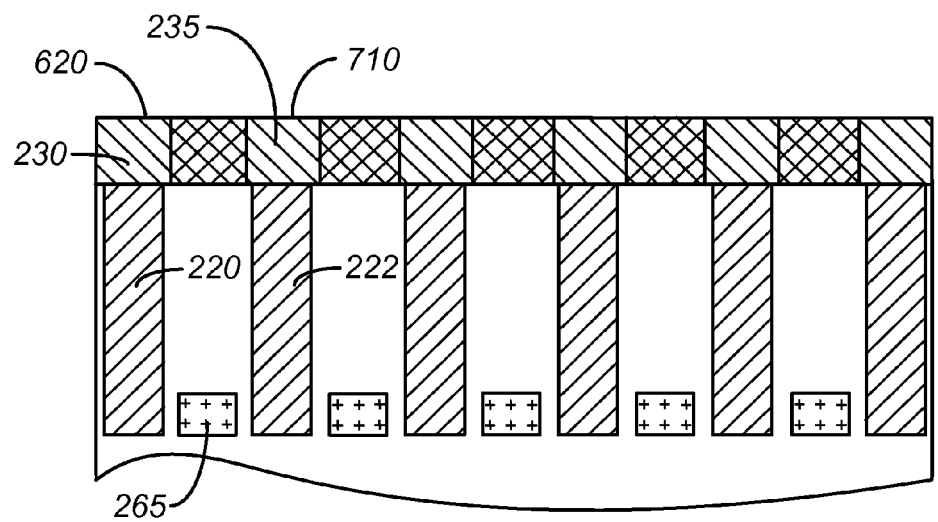

Next, the structure illustrated in FIGS. 7A-7C is planarized to expose the top surfaces 620 of the conductive elements 230, 235 resulting in the structure illustrated in FIGS. 8A-8C. A plurality of bit lines 250 comprising bit line material 710 extend in parallel in the second direction. A plurality of insulating members 240 comprising sidewall dielectric material 700 on the sidewall surfaces 610 of the first electrodes 230 in the plurality of pairs of conductive elements 230, 235. The insulating members 240 in the plurality of insulating members have a thickness 245 between corresponding first electrodes 230 and bit lines 250.

Figure 9A:
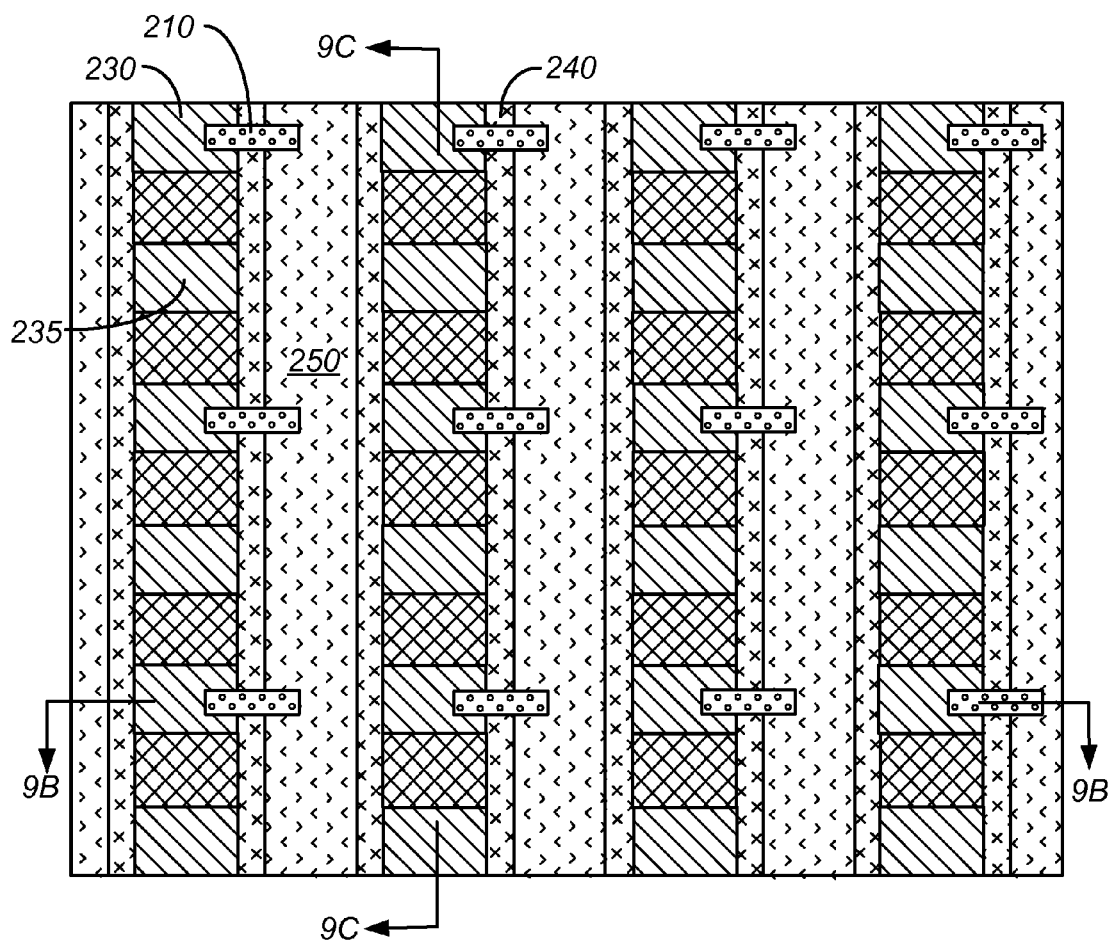
Figure 9B:
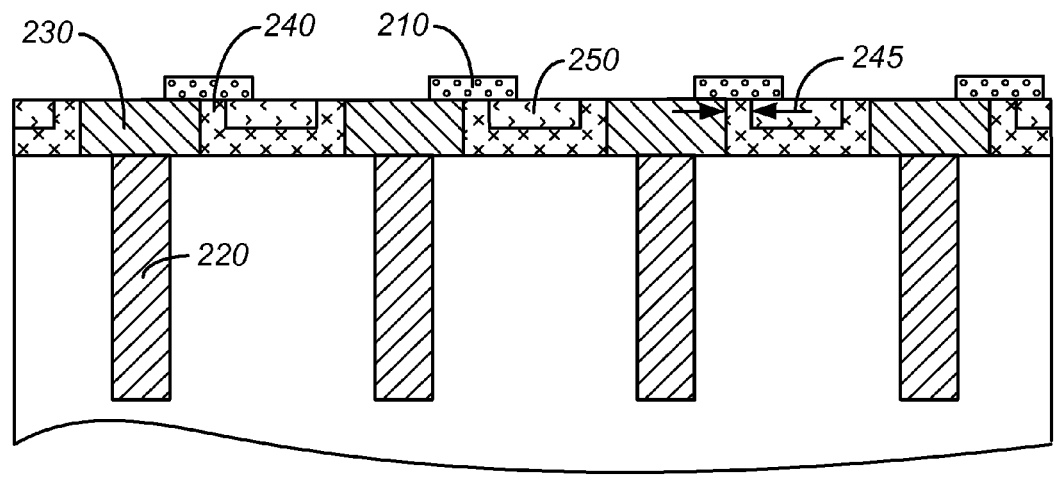
Figure 9C:
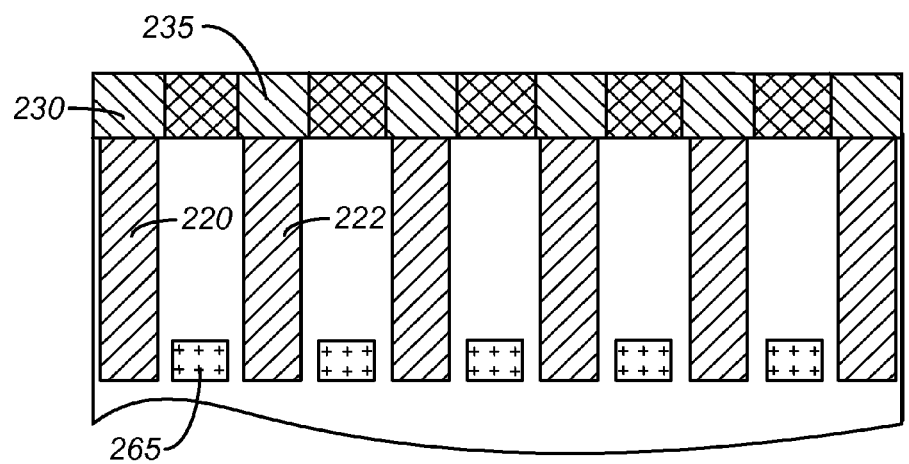

Next, a layer of memory material is patterned on the structure illustrated in FIGS. 8A-8C to form a plurality of phase change bridges 210, resulting in the subassembly illustrated in FIGS. 9A-9C. The bridges 210 contact the first electrodes 230 and extend across the insulating members 240 to the bit lines 250. The bridges 210 define an inter-electrode path between the corresponding first electrodes 230 and bit lines 250 defined by the thickness 245 of the insulating member 240. Alternatively, the phase change bridges 210 may be formed, for example, by patterning a layer of dielectric material over the structure illustrated in FIGS. 8A-8C and using that layer of dielectric material as a mask for forming the phase change bridges 210.

Figure 10A:
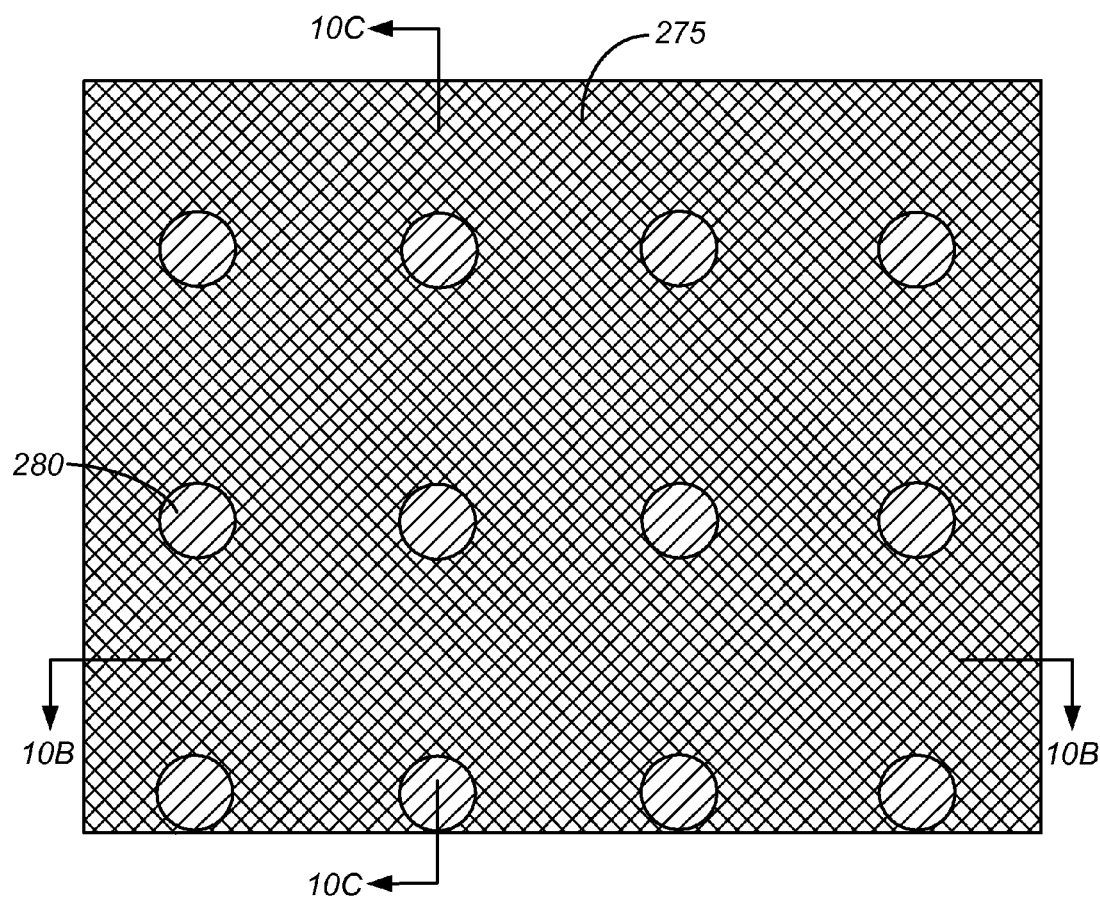
Figure 10B:
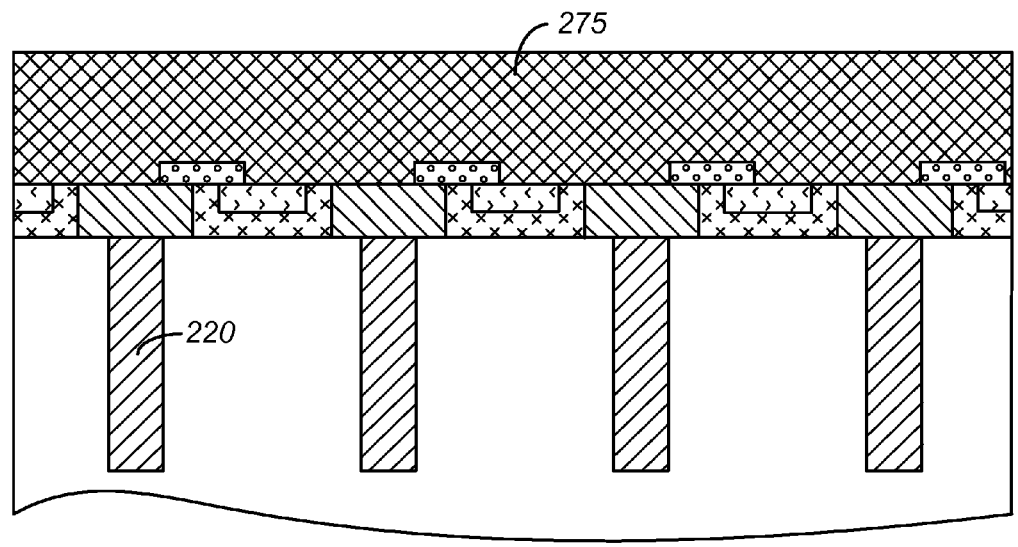
Figure 10C:
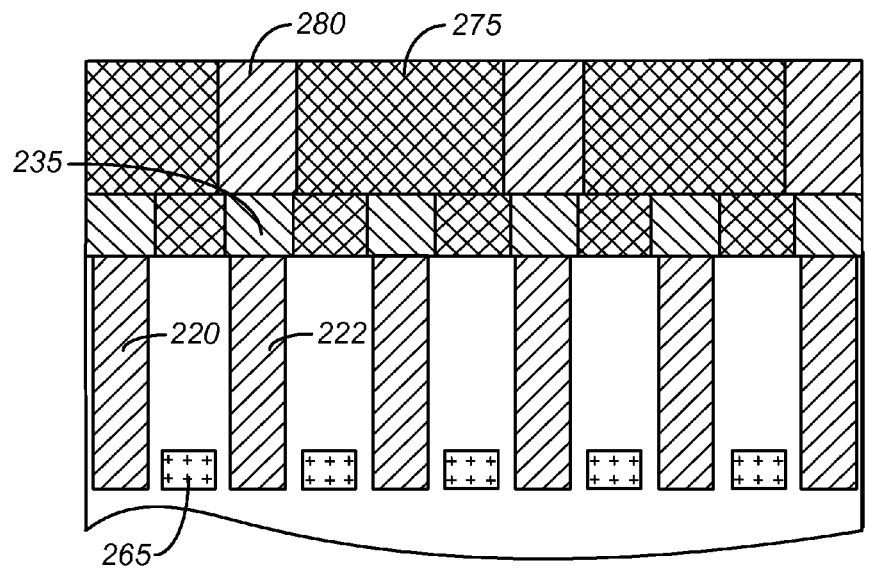

Next, a layer of second dielectric material 275 and an array of conductive vias 280 are formed on the subassembly illustrated in FIGS. 9A-9C, resulting in the structure illustrated in FIGS. 10A-10C. The conductive vias 280 are in electrical contact with corresponding second conductive elements 235.

Figure 11A:
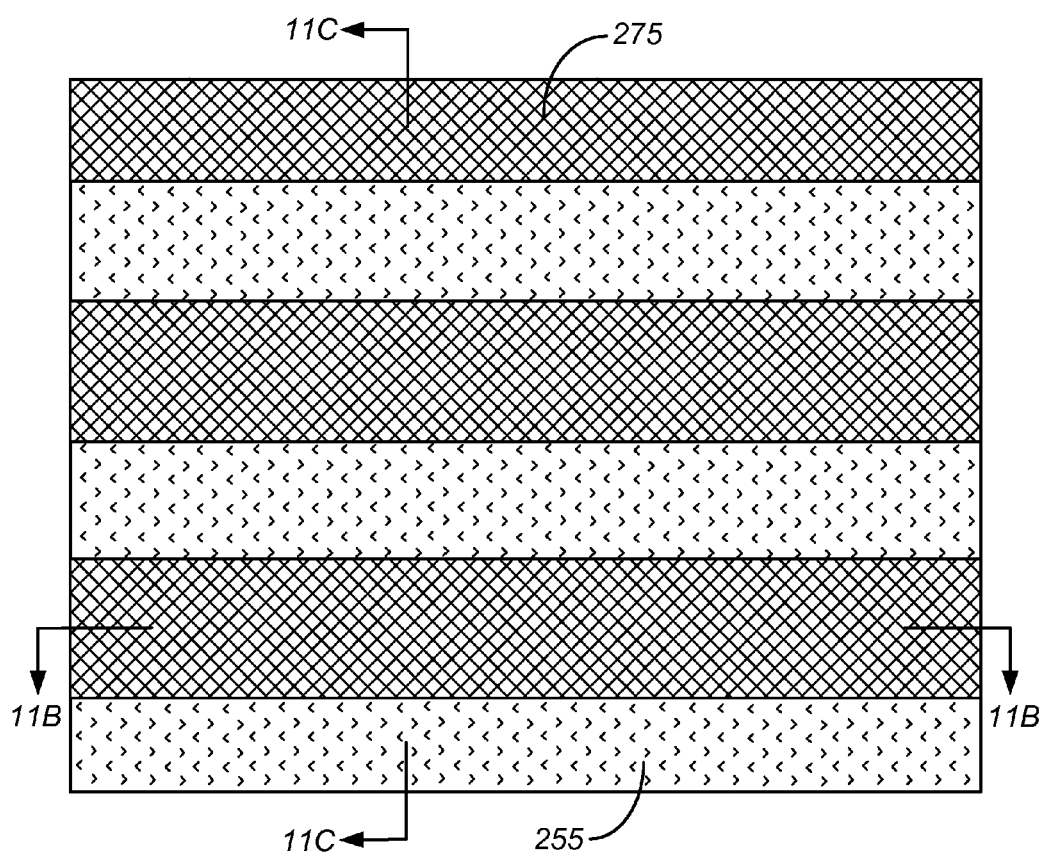
Figure 11B:
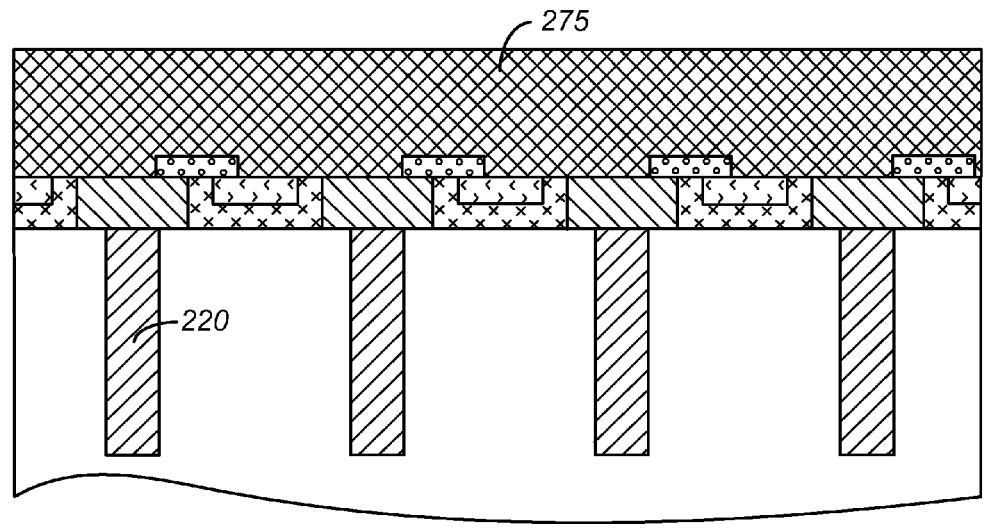
Figure 11C:
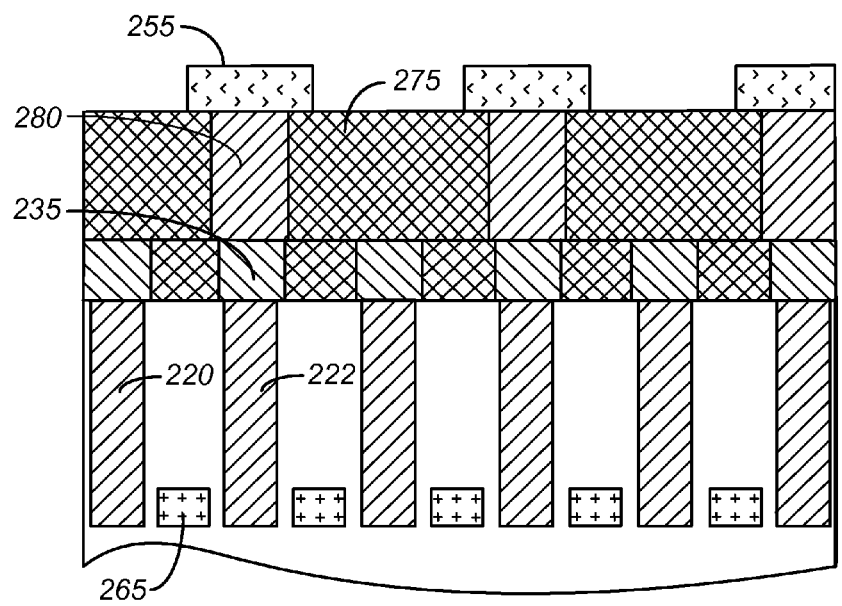

Next, a plurality of source lines 255 are formed on the second dielectric material 275 as illustrated in FIGS. 11A-11C, resulting in the array of memory cells as illustrated in FIGS. 2A-2D. The source lines 255 extend in parallel in the first direction and are in electrical contact with conductive vias 280.

An embodiment of a memory device as described herein includes a conductive bit line and a plurality of first electrodes. The memory device includes a plurality of insulating members, the insulating members having a thickness between a corresponding first electrode and a portion of the bit line acting as a second electrode. The memory device further includes an array of bridges of memory material having at least two solid phases, the bridges contacting respective first electrodes and extending across the corresponding insulating member to the bit line. The bridges define an inter-electrode path between the corresponding first electrode and the bit line defined by the thickness of the insulating member.

Advantages of an embodiment described herein include memory cells having reduced cell sizes, providing an array architecture supporting high-density devices, and a method for manufacturing such structure that meets tight process variation specifications needed for large-scale memory devices.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are incorporated by reference.

What is claimed is:

1. A memory device comprising:
    a conductive bit line comprising a bit line surface;
    a plurality of first electrodes;
    a plurality of insulating members, the insulating members having a thickness between a corresponding first electrode and a portion of the bit line; and
    an array of bridges of memory material overlying the conductive bit line and the plurality of first electrodes, the bridges contacting respective first electrodes and directly contacting the bit line surface, the bridges extending across the corresponding insulating member, the bit line acting as a second electrode, the bridges defining respective inter-electrode paths between the corresponding first electrode and the bit line.

2. The device of claim 1, further comprising:
    access circuitry for a plurality of memory cells, including a first array of conductive contacts coupled to the access circuitry, wherein first electrodes in the plurality of first electrodes are electrically coupled to corresponding conductive contacts in the first array of conductive contacts.

3. The device of claim 2, further comprising:
    a second array of conductive contacts coupled to the access circuitry; and
    a plurality of conductive source lines, the source lines electrically coupled to conductive contacts in the second array of conductive contacts.

4. The device of claim 1, wherein the memory material has at least two solid phases reversibly inducible by a current.

5. The device of claim 1, wherein the memory material has at least two solid phases including a generally amorphous phase and a generally crystalline phase.

6. The device of claim 1, wherein the thickness of the insulating member is less than a minimum feature size for a process used to form the device.

7. The device of claim 1, wherein the bridge of memory material has a thickness between about 1 nm and about 10 nm.

8. The device of claim 1, wherein the memory material comprises an alloy including a combination of two or more materials from the group of Ge, Sb, Te, Se, In, Ti, Ga, Bi, Sn, Cu, Pd, Pb, Ag, S, and Au.

9. The device of claim 1, wherein the first electrodes comprise an element chosen from a group consisting of Ti, W, Mo, Al, Ta, Cu, Pt, Ir, La, Ni, and Ru and alloys thereof.

10. The device of claim 1, wherein the first electrodes comprise Ti and N.

11. The device of claim 1, wherein the first electrodes comprise Ta and N.

12. The device of claim 1, wherein the bridges have respective bottom surfaces directly contacting the bit line and the corresponding first electrode.

13. The device of claim 1, wherein the respective inter-electrode paths between the corresponding first electrode and the bit line have a path length defined by the thickness of the corresponding insulating member.

14. The device of claim 13, wherein the bridges have an active region spaced away from the corresponding first electrode and the bit line.

15. The device of claim 1, wherein:
    the thickness of the insulating member is less than a minimum feature size for a process used to form the device; and
    the array of bridges of memory material overlies only portions of the conductive bit line and only portions of the plurality of first electrodes.

16. An electrically programmed memory device comprising:
- a conductive bit line;
- a plurality of first electrodes;
- a plurality of insulating members, the insulating members having a thickness between a corresponding first electrode and a portion of the bit line;
- the thickness of the insulating member being less than a minimum feature size for a process used to form the device; and
- an array of bridges of memory material overlying only portions of the conductive bit line and only portions of the plurality of first electrodes, the bridges contacting respective first electrodes and extending across the corresponding insulating member to the portions of the bit line, the bit line acting as a second electrode, the bridges defining respective inter-electrode paths between the corresponding first electrode and the bit line.

* * * * *